United States Patent
Tsai et al.

(10) Patent No.: US 9,424,939 B2
(45) Date of Patent: Aug. 23, 2016

(54) NON-VOLATILE MEMORY APPARATUS AND ERASING METHOD THEREOF

(71) Applicant: eMemory Technology Inc., Hsinchu (TW)

(72) Inventors: Yu-Hsiung Tsai, Hsinchu (TW); Chun-Yuan Lo, Taipei (TW)

(73) Assignee: eMemory Technology Inc., Hsinchu (TW)

(*) Notice: Subject to any disclaimer, the term of this patent is extended or adjusted under 35 U.S.C. 154(b) by 0 days.

(21) Appl. No.: 14/920,895

(22) Filed: Oct. 23, 2015

(65) Prior Publication Data

US 2016/0042795 A1 Feb. 11, 2016

Related U.S. Application Data

(62) Division of application No. 14/295,358, filed on Jun. 4, 2014, now Pat. No. 9,196,367.

(60) Provisional application No. 61/973,852, filed on Apr. 2, 2014.

(51) Int. Cl.
| | |
|---|---|
| *G11C 16/04* | (2006.01) |
| *G11C 16/14* | (2006.01) |
| *H02M 1/14* | (2006.01) |
| *H02M 3/07* | (2006.01) |
| *H03K 19/0185* | (2006.01) |
| *G11C 16/16* | (2006.01) |

(52) U.S. Cl.
CPC ............ *G11C 16/14* (2013.01); *G11C 16/16* (2013.01); *H02M 1/14* (2013.01); *H02M 3/07* (2013.01); *H03K 19/018514* (2013.01)

(58) Field of Classification Search
USPC ....................................... 365/185.11, 185.29
See application file for complete search history.

(56) References Cited

U.S. PATENT DOCUMENTS

| | | | | |
|---|---|---|---|---|
| 2012/0087190 A1* | 4/2012 | Lee | ..................... | G11C 16/0416 365/185.17 |
| 2013/0033934 A1* | 2/2013 | Strenz | ................ | G11C 16/0425 365/185.14 |

* cited by examiner

*Primary Examiner* — Hoai V Ho
(74) *Attorney, Agent, or Firm* — Jianq Chyun IP Office

(57) ABSTRACT

The invention provides a non-volatile memory apparatus and an erasing method thereof. The non-volatile memory apparatus includes a plurality of memory sectors and a control voltage provider. The memory sectors disposed in a same well, wherein, each of the memory sectors includes a plurality of memory cells for respectively receiving a plurality of control line signals. The control voltage provider provides the control line signals to the memory cells of each of the first memory sectors. When an erasing operation is operated, one of the memory sectors is selected for erasing and the control voltage provider provides the control line signals of the selected memory sector with an erase control voltage and provides the control line signals of the un-selected memory sectors with a un-erase control voltage, voltage levels of the erase control voltage and the un-erase control voltage are different.

4 Claims, 8 Drawing Sheets

NON-VOLATILE MEMORY APPARATUS AND ERASING METHOD THEREOF

CROSS-REFERENCE TO RELATED APPLICATION

This application is a divisional application of and claims the priority benefit of U.S. application Ser. No. 14/295,358, filed on Jun. 4, 2014, now allowed, which claims the priority benefits of U.S. provisional application Ser. No. 61/973,852, filed on Apr. 2, 2014. The entirety of each of the above-mentioned patent applications is hereby incorporated by reference herein and made a part of this specification.

BACKGROUND

1. Field of the Invention

The invention relates to a non-volatile memory apparatus and an erasing method thereof. Particularly, the invention relates to a non-volatile memory apparatus capable of erasing at least one of memory sectors which disposed in a same well.

2. Description of Related Art

In prior art, when an erasing operation is operated on a flash memory apparatus, all the memory sectors disposed in a same well must be erased simultaneously. Referring to FIG. 1A, a flash memory apparatus 110 includes memory sector 0 MS0 and a memory sector 1 MS1, a sector 0 selector SSD0 and a sector 1 selector SSD1. The sector 0 selector SSD0 corresponds to the memory sector 0 MS0, and the sector 1 selector SSD1 corresponds to the memory sector 1 MS1. The memory sector 0 MS0 and the memory sector 1 MS1 are respectively disposed in different wells. The sector 0 selector SSD0 is disposed between the memory sector 0 MS0 and the memory sector 1 MS1 for separating the memory sector 0 MS0 and the memory sector 1 MS1. When an erasing operation is operated on the flash memory apparatus 110, at least one of the memory sector 0 MS0 and the memory sector 1 MS1 is selected for erasing, and all of the memory cells in the selected memory sector are erased simultaneously. That is, in prior art, it is impossible to erase a part of memory cells of the memory sector 0 MS0 or the memory sector 1 MS1, and a small size memory sector erasing capability can not be achieved in the flash memory apparatus 100.

On the other hand, for the small size memory sector erasing purpose, another prior art flash memory apparatus 120 is shown as FIG. 1B. The memory sector 0 MS0 in FIG. 1A can be divided into a memory sector 01 MS01 and a memory sector 02 MS02 in FIG. 1B, and the memory sector 1 MS1 in FIG. 1A can be divided into a memory sector 11 MS11 and a memory sector 12 MS12 in FIG. 1B. Furthermore, the memory sectors MS01~MS12 can be respectively disposed in four different wells, and two sector selectors SSD01 and SSD02 and two sector selectors SSD11 and SSD12 are necessary. The sector 01 selector SSD01 corresponds to the memory sector 01 MS01, the sector 02 selector SSD02 corresponds to the memory sector 02 MS02, the sector 11 selector SSD11 corresponds to the memory sector 11 MS11, and the sector 12 selector SSD12 corresponds to the memory sector 12 MS12. That is, the number of wells and the sector selecting devices are increased in the flash memory apparatus 120, and the chip size of the flash memory apparatus 120 is increased.

SUMMARY OF THE INVENTION

The invention is directed to a non-volatile memory apparatus and an erasing method thereof, which can erase one of a plurality of memory sectors disposed in the same well.

The invention provides a non-volatile memory apparatus. The non-volatile memory apparatus includes a plurality of first memory sectors and a control voltage provider. The first memory sectors disposed in a first well, wherein, each of the first memory sectors includes a plurality of memory cells for respectively receiving a plurality of control line signals. The control voltage provider is coupled to the first memory sectors for providing the control line signals to the memory cells of each of the first memory sectors. When an erasing operation is operated, one of the first memory sectors is selected for erasing and the control voltage provider provides the control line signals of the selected memory sector with an erase control voltage and provides the control line signals of the un-selected memory sectors with a un-erase control voltage, voltage levels of the erase control voltage and the un-erase control voltage are different.

The invention also provides an erasing method for a non-volatile memory apparatus. The step of the erasing method includes: providing a plurality of control line signals to a plurality of memory cells of each of a plurality of first memory sectors in the non-volatile memory apparatus, wherein the first memory sectors are disposed in a first well; when an erasing operation is operated, selecting one of the first memory sectors for erasing; providing the control line signals of the selected memory sector with an erase control voltage; and providing the control line signals of the un-selected memory sectors with a un-erase control voltage, wherein voltage levels of the erase control voltage and the un-erase control voltage are different.

According to the above descriptions, in the invention, the erasing operation may be operated on one or some of a plurality of memory sectors which are disposed in a same well. In consideration for a small size memory sector erasing capability, large amount of cells for disposing memory sectors is not necessary. Corresponding, isolated transistors are not necessary for the non-volatile memory apparatus according to the presented application. Such as that, chip size of the non-volatile memory apparatus can be reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
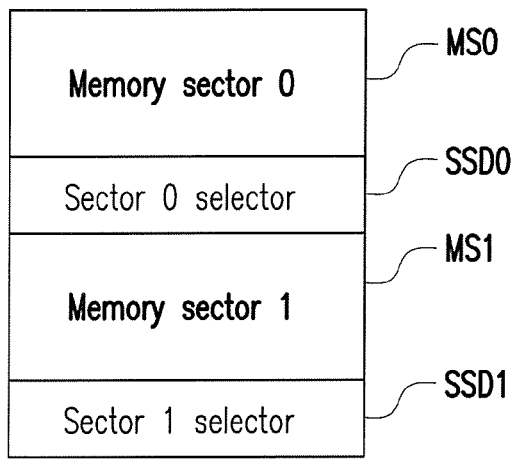
FIG. 1A and FIG. 1B are schematic diagrams of prior art flash memory.
Figure 1B:
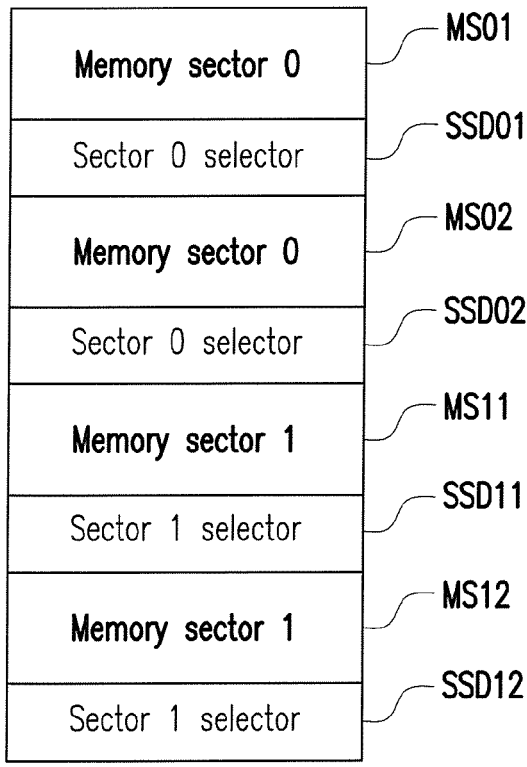
Figure 2:
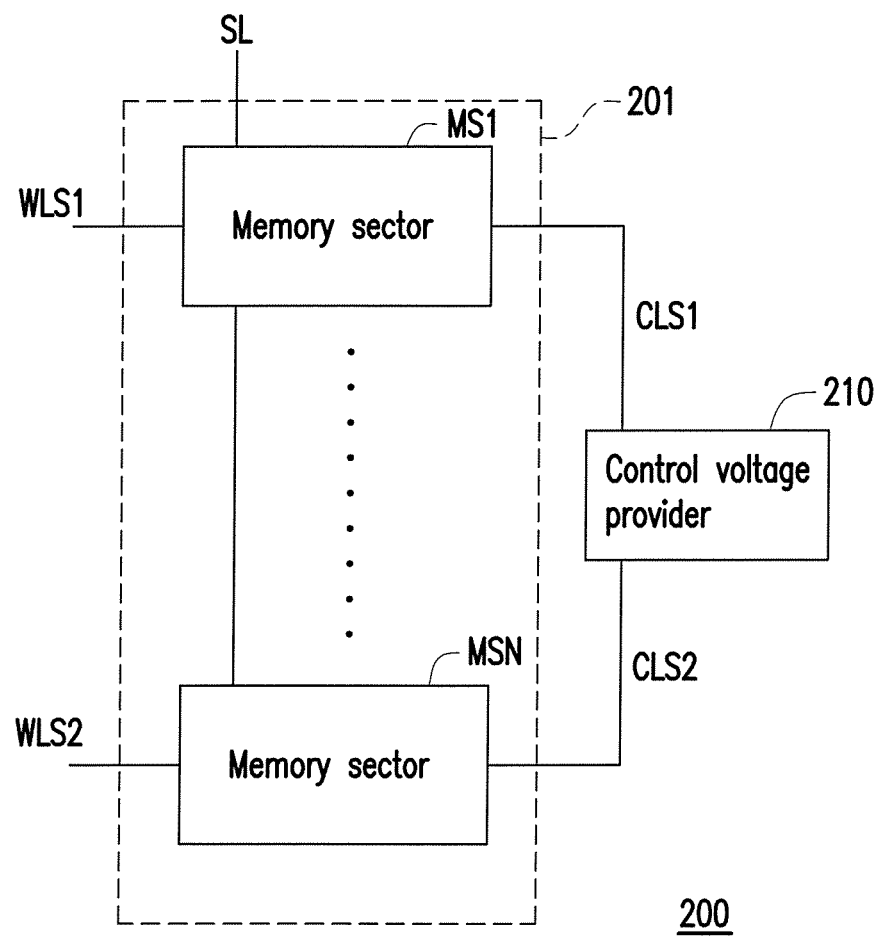
FIG. 2 is a block diagram of a non-volatile memory apparatus 200 according to an embodiment of the invention.

Referring to FIG. 2, FIG. 2 is a block diagram of a non-volatile memory apparatus 200 according to an embodiment of the invention. The non-volatile memory apparatus 200 includes a plurality of memory sectors MS1-MSN and a control voltage provider 210. The memory sectors MS1-MSN are disposed in a well 201. The well 201 may be a N-type well. When an erasing operation is operated on the non-volatile memory apparatus 200, and at least one of the memory sectors MS1~MSN is selected for erasing, the control voltage provider 210 provides control line signals to the selected memory sector with an erase control voltage and provides control line signals to the un-selected memory sector with a un-erase control voltage. For example, if the memory sector MS1 is selected for erasing and the memory sector MSN is not selected for erasing, the control line signals CLS1 and CLS2 are provided by the control voltage provider 210, wherein, a voltage level of the control line signals CLS1 equals to the erase control voltage, and a voltage level of the control line signals CLS2 equals to the un-erase control voltage. In this embodiment, the erase control voltage may equal to −6.5V and the un-erase control voltage may equal to 6.5V.

On the other hand, when the erasing operation is operated, a voltage applied on the well 210 may equal to 6.5V, and a voltage level on the word line signals WLS1-WLS2 may equal to 3.0V. That is, the voltage levels of the voltage applied on the well 210 and the un-erase control voltage are the same. The voltage level of the un-erase control voltage is additive inverse of the voltage level of the erase control voltage.

Figure 3A:
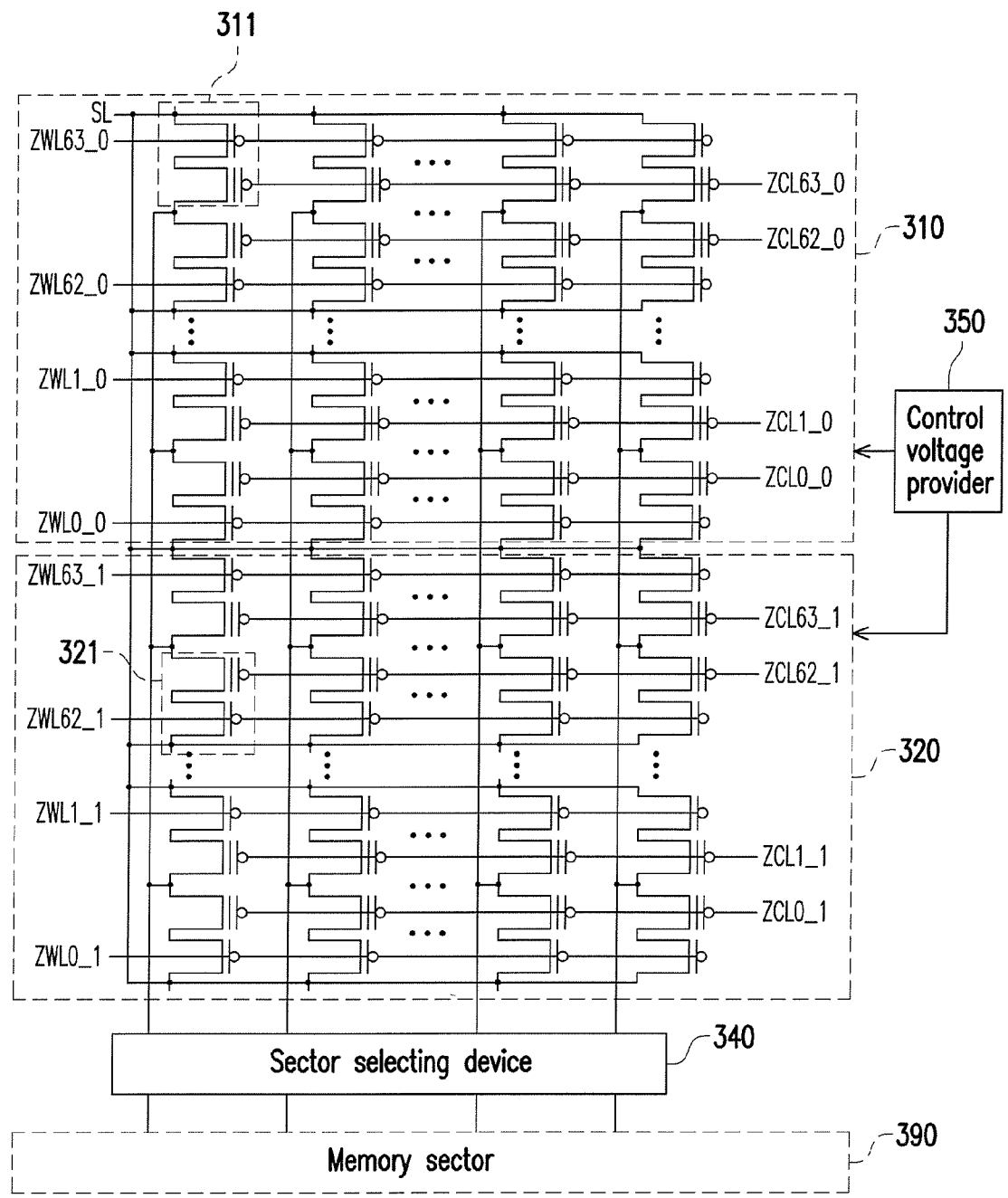
FIG. 3A is a block diagram of a non-volatile memory apparatus 300 according to another embodiment of the invention.

Referring to FIG. 3A, FIG. 3A is a block diagram of a non-volatile memory apparatus 300 according to another embodiment of the invention. The non-volatile memory apparatus 300 includes memory sectors 310 and 320 and a control voltage provider 350. The memory sectors 310 and 320 are disposed in a same well, and a voltage is applied on the well which is coupled to a source line SL of all of memory cells in the memory sectors 310 and 320. In this embodiment, the well may be a N-type well. Each of the memory cells (ex. memory cell 311 and memory cell 321) includes two P-type transistors. A plurality of word line signals ZWL0_0-ZWL63_0 and ZWL0_1-ZWL63_1 are respectively transported to memory cells of memory sectors 310 and 320. A plurality of control line signals ZCL0_0-ZCL63_0 and ZCL0_1-ZCL63_1 are respectively transported to memory cells of memory sectors 310 and 320, too. When an erasing operation is operated, one of the memory sectors 310 and 320 is selected for erasing and the control voltage provider 350 provides the control line signals ZCL0_0-ZCL63_0 and ZCL0_1-ZCL63_1 of the selected memory sector with an erase control voltage and provides the control line signals ZCL0_0-ZWL63_0 and ZCL0_1-ZCL63_1 of the un-selected memory sectors with a un-erase control voltage.

For example, when the erasing operation is operated, memory sector 310 is selected to be the selected memory sector, and the memory sector 320 may be selected to be the un-selected memory sector. The control voltage provider 350 may provide the control line signals ZCL0_0-ZCL63_0 with the erase control voltage, and provide the control line signals ZCL0_1-ZCL63_1 with the un-erase control voltage. Wherein, a voltage level of the un-erase control voltage may be equaled to a voltage level on the source line SL, and a voltage level of the erase control voltage may be smaller than the voltage level of the un-erase control voltage. In this embodiment, the voltage levels of the erase control voltage and the un-erase control voltage may be −6.5V and 6.5V respectively, and the voltage level of the source line may be 6.5V.

On the other hand, when the erasing operation is operated, voltage levels of the word line signals ZWL0_0-ZWL63_0 and ZWL0_1-ZWL63_1 may be the same. In this embodiment, the voltage level of the word line signals ZWL0_0-ZWL63_0 and ZWL0_1-ZWL63_1 may be 3.0V.

In such manner, the memory cells in the memory sector 310 are erased, and the memory cells in the memory sector 320 are not erased. That is, only one or some of all of the memory sectors disposed in same well may be selected to be erased, and a small size memory sector erasing capability is achieved.

Please noted here, the memory cells 311 and 321 formed by two transistors are only for reference and do not use to limit scope of present application. Any memory cell for flash memory can be used in the memory apparatus 300.

On the other hand, a sector selecting device 340 is also disposed in the non-volatile memory apparatus 300, and the sector selecting device 340 is coupled to the bit lines of the memory cells in the memory sectors 310 and 320. Further, the sector selecting device 340 is also coupled to another memory sector 390.

Please note here, the sector selecting device 340 is used to isolate the memory sector 320 from the memory sector 390 when the erasing operation is operated on at least one of the memory sectors 310 and 320. On the other hand, the sector selecting device 340 is used for memory cell selection when a program or read operation in operated on the non-volatile memory apparatus 300.

Figure 3B:
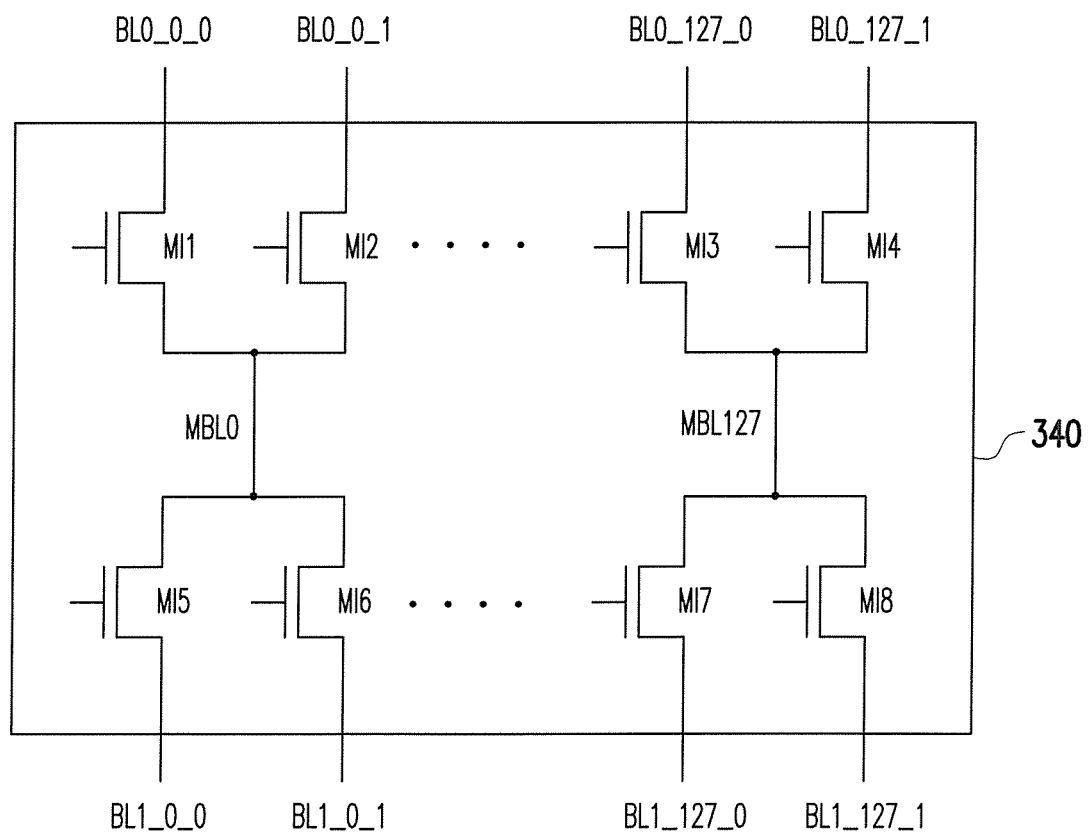
FIG. 3B is a block diagram of the sector selecting device according to the embodiment in FIG. 3A of the invention.

Referring to FIG. 3B, FIG. 3B is a block diagram of the sector selecting device according to the embodiment in FIG. 3A of the invention. In FIG. 3B, the sector selecting device 340 includes a plurality of transistors MI1~MI8. First ends of the transistors MI1 and MI2 are respectively coupled to bit lines BL0_0_0 and BL0_0_1, and second ends of the transistors MI1 and MI2 are coupled to a main bit line MBL0. First ends of the transistors MI5 and MI6 are coupled to the main bit line MBL0, and second ends of the transistors MI5 and MI6 are respectively coupled to bit lines BL1_0_0 and BL1_0_1. The bit lines BL0_0_0 and BL0_0_1 are bit lines from the memory sectors 310 and 320, and the bit lines BL1_0_0 and BL1_0_1 are bit lines from another memory sector. Moreover, first ends of the transistors MI3 and MI4 are respectively coupled to bit lines BL0_127_0 and BL0_127_1, and second ends of the transistors MI3 and MI4 are coupled to a main bit line MBL127. First ends of the transistors MI7 and MI8 are coupled to the main bit line MBL127, and second ends of the transistors MI7 and MI8 are respectively coupled to bit lines BL1_127_0 and BL1_127_1. The bit lines BL0_127_0 and BL0_127_1 are bit lines from the memory sectors 310 and 320, and the bit lines BL1_127_0 and BL1_127_1 are bit lines from another memory sector.

Figure 4:
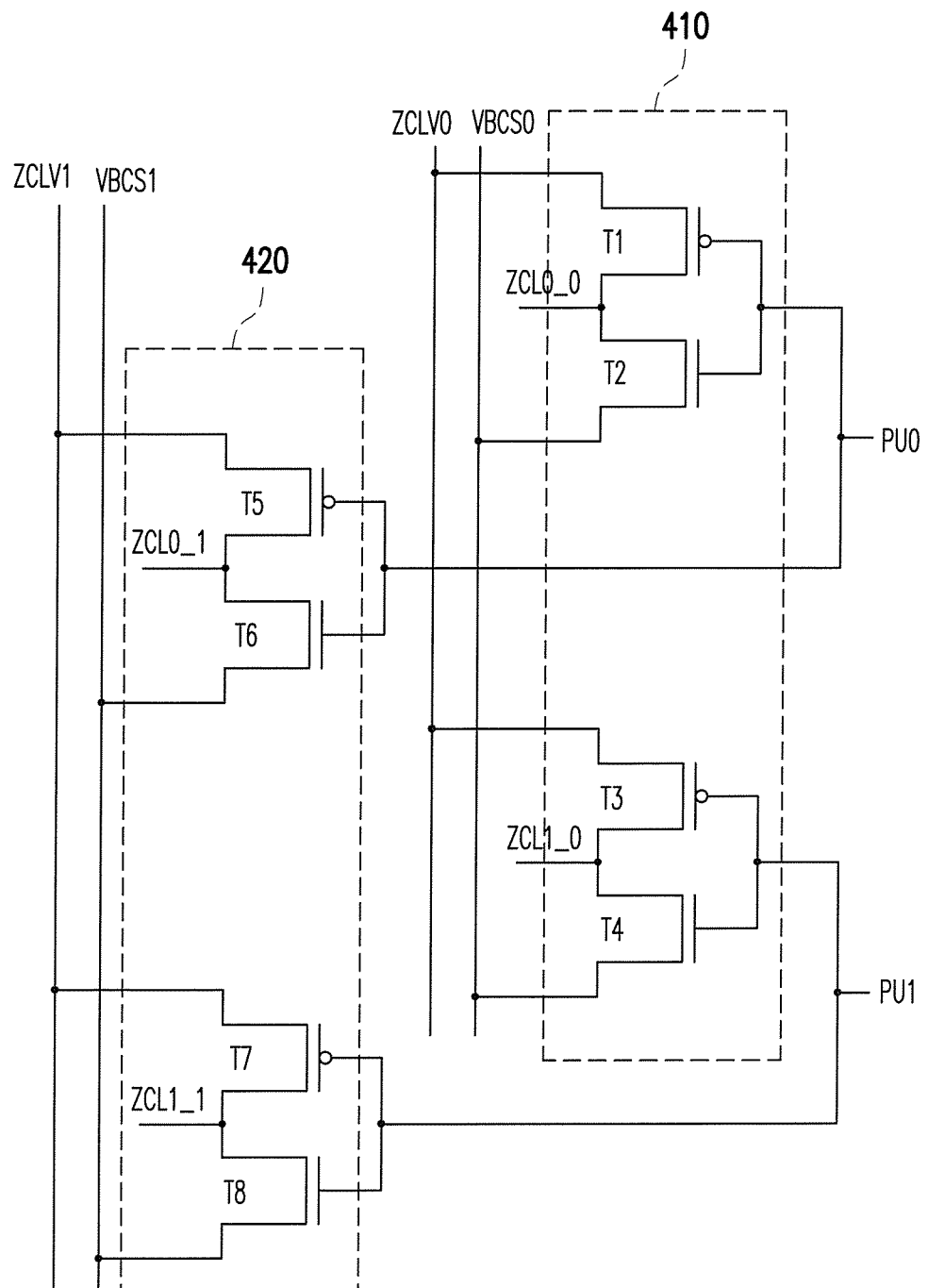
FIG. 4 is a circuit diagram of a control voltage provider according to an embodiment of the invention.

Referring to FIG. 4, FIG. 4 is a circuit diagram of a control voltage provider according to an embodiment of the invention. The control voltage provider 400 includes voltage selectors 410 and 420. The voltage selector 410 is coupled to a first vertical control signal line ZCLV0 and a first voltage line VBCS0. The voltage selector 410 selects a voltage on one of the first vertical control signal line ZCLV0 and the first voltage line VBCS0 according to an operation control signal PU0 for generating the control line signals ZCL0_0 and ZCL1_0. The voltage selector 420 is coupled to a second vertical control signal line ZCLV1 and a second voltage line VBCS1. The voltage selector 420 selects a voltage on one of the second vertical control signal line ZCLV1 and the second voltage line VBCS1 according to an operation control signal PU1 for generating the control line signals ZCL0_1 and ZCL1_1. It should be noted here, the control line signals ZCL0_0 and ZCL1_0 are provided to the memory cells in a first memory sector and the control line signals ZCL0_1 and ZCL1_1 are provided to the memory cells in a second memory sector, wherein, the first and second memory sectors are disposed in the same well.

In FIG. 4, the voltage selector 410 includes transistors T1-T4 respectively form four switches. The transistor T1 is coupled between the first vertical control signal line ZCLV0 and an output end of the voltage selector 410, and is controlled by the operation control signal PU0. The transistor T2 is coupled between the first voltage line VBCS0 and the output end of the voltage selector 410, and is controlled by the operation control signal PU0. The transistor T3 is coupled between the first vertical control signal line ZCLV0 and another output end of the voltage selector 410, and is controlled by the operation control signal PU0. The transistor T4 is coupled between the first voltage line VBCS0 and the output end (which the transistor T3 coupled to) of the voltage selector 410, and is controlled by the operation control signal PU0. The control line signals ZCL0_0 and ZCL1_0 are provided to the first memory sector.

On the other hand, the voltage selector 420 includes transistors T5-T8 respectively form four switches. The transistor T5 is coupled between the second vertical control signal line ZCLV1 and an output end of the voltage selector 420, and is controlled by the operation control signal PU0. The transistor T6 is coupled between the second voltage line VBCS1 and the output end of the voltage selector 420, and is controlled by the operation control signal PU0. The transistor T7 is coupled between the second vertical control signal line ZCLV1 and another output end of the voltage selector 420, and is controlled by the operation control signal PU1. The transistor T8 is coupled between the second voltage line VBCS1 and the output end (which the transistor T7 coupled to) of the voltage selector 420, and is controlled by the operation control signal PU1. The control line signals ZCL0_1 and ZCL1_1 are provided to the second memory sector.

The transistors T1, T3, T5 and T7 are P-type transistors, the transistors T2, T4, T6 and T8 are N-type transistors.

When an erasing operation is operated, the first memory sector is selected to be erased, and the second memory sector is not selected to be erased, the voltage selector 410 provides the control line signals ZCL0_0 and ZCL1_0 with an erase control voltage (ex. −6.5V) and the control line signals ZCL0_1 and ZCL1_1 with an un-erase control voltage (ex. 6.5V).

That is, when the erasing operation is operated, the erase control voltage is provided to the first voltage line VBCS0 and the un-erase control voltage is provided to the second vertical control signal line ZCLV1. Voltage levels of the first vertical control signal line ZCLV0 and the second voltage line VBCS1 are 0V. Furthermore, voltage levels of the operation control signals PU0 and PU1 are 0V.

Figure 5:
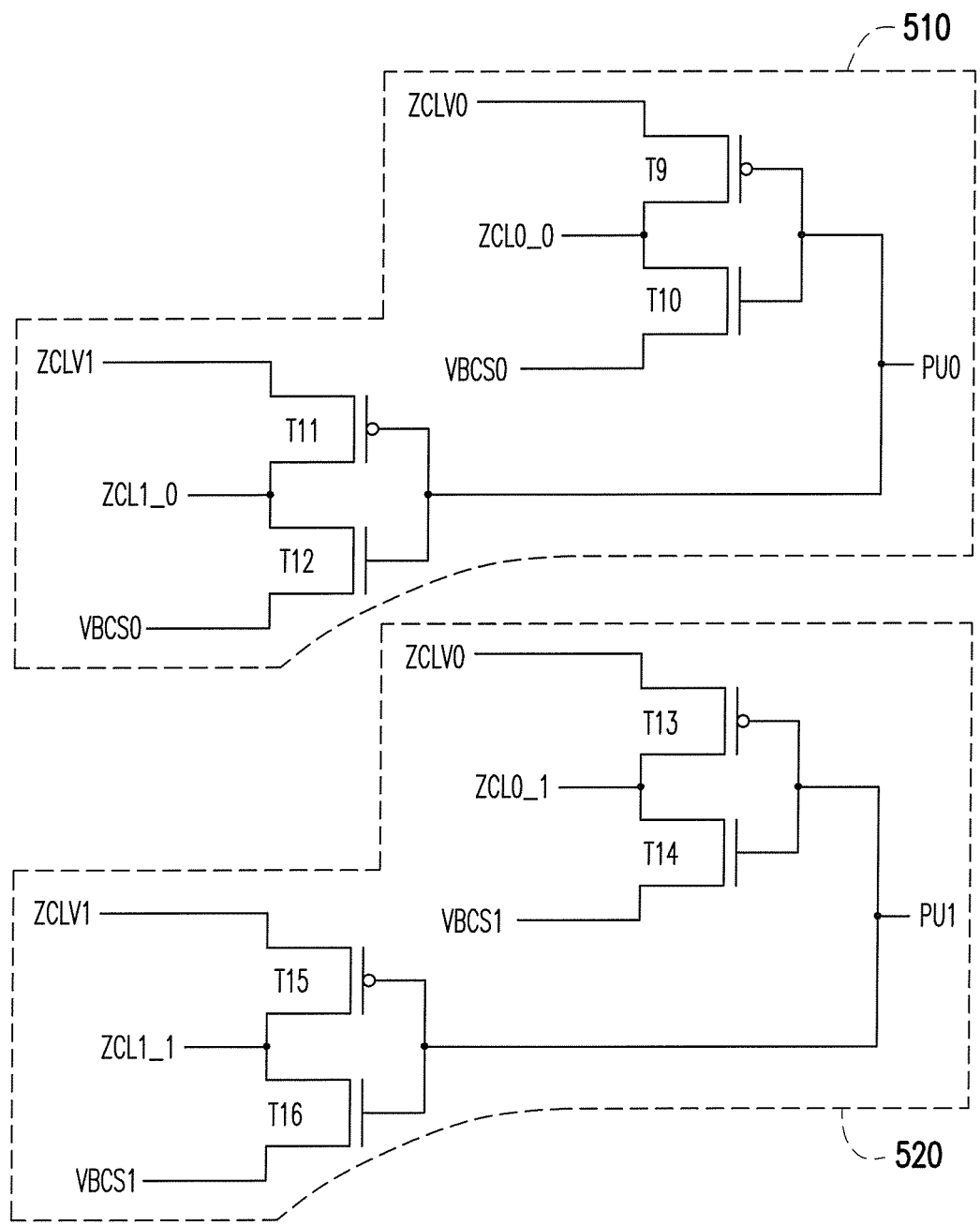
FIG. 5 is another circuit diagram of a control voltage provider according to an embodiment of the invention.

Referring to FIG. 5, FIG. 5 is another circuit diagram of a control voltage provider according to an embodiment of the invention. The control voltage provider 400 includes voltage selectors 510 and 520. The voltage selector 510 is coupled to the first vertical control signal line ZCLV0, the second vertical control signal line ZCLV1 and a first voltage line VBS0. The voltage selector 510 selects a voltage on one of the first and second vertical control signal lines ZCLV0, ZCLV1 and the first voltage line VBCS0 according to the operation control signal PU0 for generating the control line signals ZCL0_0 and ZCL1_0. The voltage selector 520 is coupled to the first and second vertical control signal lines ZCLV0, ZCLV1 and a second voltage line VBCS1. The voltage selector 520 selects a voltage on one of the first and second vertical control signal line ZCLV0, ZCLV1 and the second voltage line VBCS1 according to the operation control signal PU1 for generating the control line signals ZCL0_1 and ZCL1_1.

In FIG. 5, the voltage selector 510 includes transistors T9-T12 respectively form four switches. The transistor T9 is coupled between the first vertical control signal line ZCLV0 and an output end of the voltage selector 510, and is controlled by the operation control signal PU0. The transistor T10 is coupled between the first voltage line VBCS0 and the output end of the voltage selector 510, and is controlled by the operation control signal PU0. The transistor T11 is coupled between the second vertical control signal line ZCLV1 and another output end of the voltage selector 510, and is controlled by the operation control signal PU0. The transistor T12 is coupled between the first voltage line VBCS0 and the output end (which the transistor T11 coupled to) of the voltage selector 510, and is controlled by the operation control signal PU0. The control line signals ZCL0_0 and ZCL1_0 are provided to the first memory sector.

On the other hand, the voltage selector 520 includes transistors T13-T16 respectively form four switches. The transistor T13 is coupled between the first vertical control signal line ZCLV0 and an output end of the voltage selector 520, and is controlled by the operation control signal PU1. The transistor T14 is coupled between the second voltage line VBCS1 and the output end of the voltage selector 520, and is controlled by the operation control signal PU1. The transistor T15 is coupled between the second vertical control signal line ZCLV1 and another output end of the voltage selector 520, and is controlled by the operation control signal PU1. The transistor T16 is coupled between the second voltage line VBCS1 and the output end (which the transistor T15 coupled to) of the voltage selector 520, and is controlled by the operation control signal PU1. The control line signals ZCL0_1 and ZCL1_1 are provided to the second memory sector.

The transistors T9, T11, T13 and T15 are P-type transistors, the transistors T10, T12, T14 and T16 are N-type transistors.

When an erasing operation is operated, the first memory sector is selected to be erased, and the second memory sector is not selected to be erased, the voltage selector 510 provides the control line signals ZCL0_0 and ZCL1_0 with the erase control voltage (ex. −6.5V) and the control line signals ZCL0_1 and ZCL1_1 with the un-erase control voltage subtracted by a threshold voltage (ex. 6.5V−Vt). The threshold voltage Vt is a turned on voltage of the transistor of transistors T14 and T16.

That is, when the erasing operation is operated, the erase control voltage is provided to the first voltage line VBCS0 and the un-erase control voltage is provided to the second voltage line VBCS1. Voltage levels of the first and second vertical control signal lines ZCLV0 and ZCLV1 are 0V. Furthermore, voltage levels of the operation control signals PU0 and PU1 are respectively 0V and 6.5V.

Figure 6:
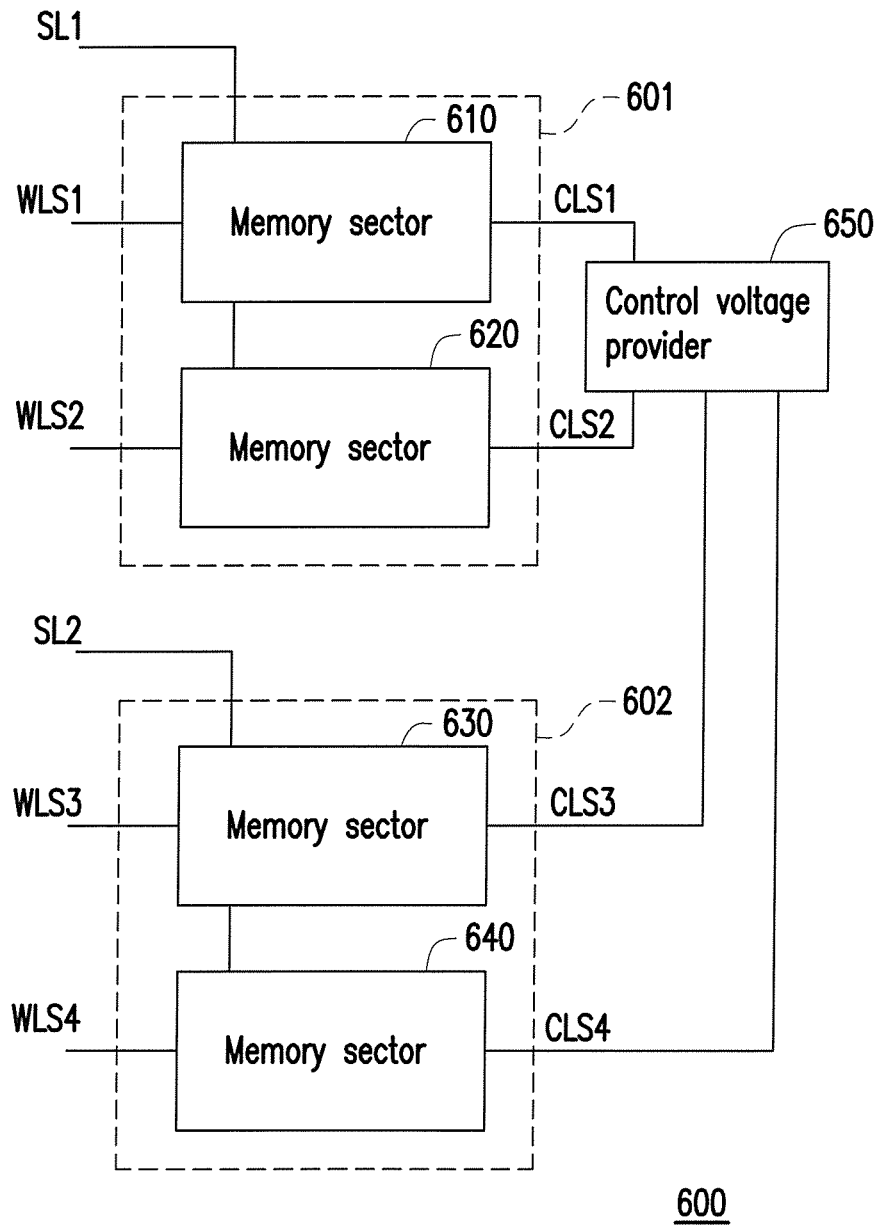
FIG. 6 is a block diagram of a non-volatile memory apparatus 600 according to another embodiment of the invention.

Referring to FIG. 6, FIG. 6 is a block diagram of a non-volatile memory apparatus 600 according to another embodiment of the invention. The non-volatile memory apparatus 600 may be a flash memory apparatus. The non-volatile memory apparatus 600 includes memory sectors 610-640 and a control voltage provider 650. The memory sectors 610 and 620 disposed in a first well 601, and the memory sectors 630 and 640 are disposed in a second well 602. The wells 601 and 602 are different wells, and in this embodiment, types of well 601 and 602 are the same.

The well 601 is coupled to a source line SL1 of memory cells in memory sectors 610 and 620. The well 602 is coupled to a source line SL2 of memory cells in memory sectors 630 and 640. The word line signals WLS1-WLS are respectively provided to memory cells of the memory sectors 610-640.

The control voltage provider 650 is coupled to the memory sectors 610-640, and respectively provides a plurality of control line signals CLS1-CLS4 to the memory sectors 610-640. When one of the memory sectors 610 and 620 is erased, the control voltage provider 650 may provide one of the control line signals CLS1-CLS2 (ex. CLS1) with an erase control voltage for erasing one of the memory sectors 610-620 (ex. 610), and provide the control line signal CLS2 with an un-erase control voltage to prevent the memory sector 620 from erasing. For the memory sectors 630 and 640 which are not selected for erasing, the control voltage provider 650 may provide the control line signal CSL3-CLS4 with 0V which is between the un-erase control voltage and the erase control voltage.

On the other hand, the control voltage provider 650 may support a programming operation of the non-volatile memory apparatus 600. In the programming operation, memory cells on one of the control lines are selected and the corresponding control line signal can be set to a programming control voltage (ex. 6.5V). The source line corresponding to the selected memory cells may be coupled to a high voltage (ex. 5V), and another source line may be coupled to a low voltage (ex. 3V). Furthermore, voltage levels of the control line signals of the unselected control lines may be set to the low voltage, and the programming operation can be achieved.

Figure 7:
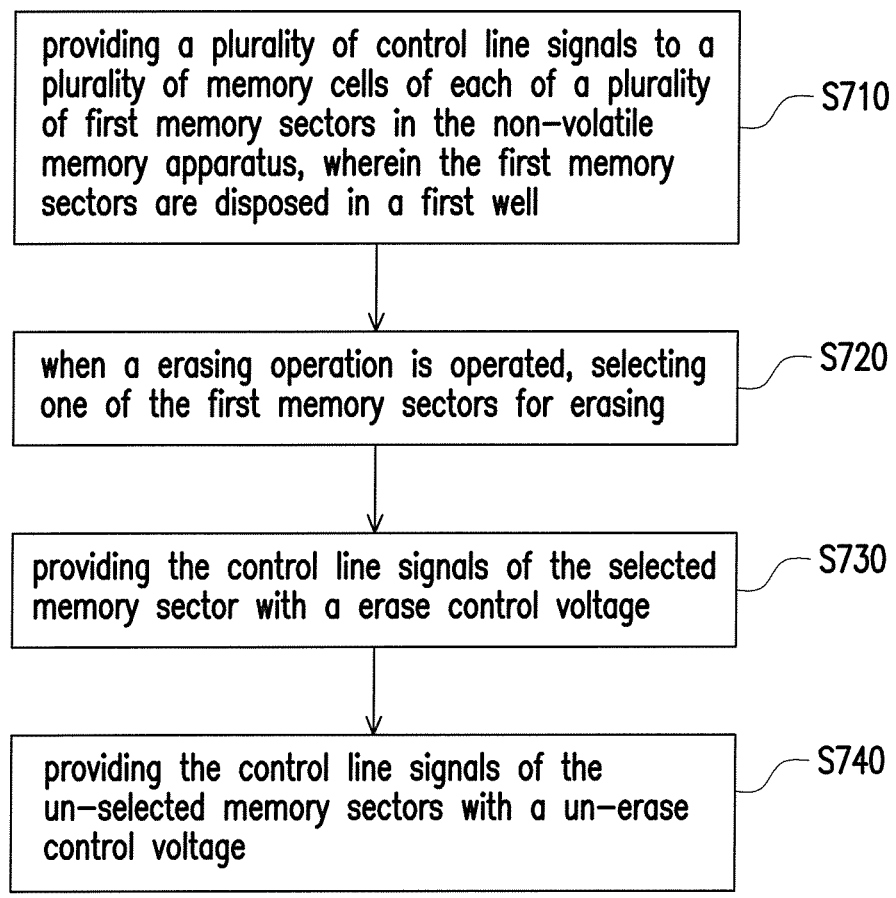
FIG. 7 is a flow chart of an erasing method for a non-volatile memory apparatus according to an embodiment of the invention.

Referring to FIG. 7, FIG. 7 is a flow chart of an erasing method for a non-volatile memory apparatus according to an embodiment of the invention. The method includes: in step S710, providing a plurality of control line signals to a plurality of memory cells of each of a plurality of first memory sectors in the non-volatile memory apparatus, wherein the first memory sectors are disposed in a first well; in step S720, when an erasing operation is operated, selecting one of the first memory sectors for erasing; in step S730, providing the control line signals of the selected memory sector with an erase control voltage; and in step S740, providing the control line signals of the un-selected memory sectors with an un-erase control voltage.

Operation details of the method for erasing the non-volatile memory apparatus of the present embodiment have been described in detail in the aforementioned embodiment with reference of the non-volatile memory apparatus, so that detailed descriptions thereof are not repeated.

In summary, each of the memory sectors in a same well is controlled by voltage levels of the control lines signals. That is, one or some memory sectors in a same well can be erased through the control line signal provided by the control voltage provider. A small size memory sector erasing capability is achieved without increasing chip size of the non-volatile memory apparatus.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile memory apparatus, comprising:
   a plurality of first memory sectors, disposed in a first well, wherein, each of the first memory sectors comprises a plurality of memory cells for respectively receiving a plurality of control line signals; and
   a control voltage provider, coupled to the first memory sectors for providing the control line signals to the memory cells of each of the first memory sectors,
   wherein, when an erasing operation is operated, one of the first memory sectors is selected for erasing and the control voltage provider provides the control line signals of the selected memory sector with an erase control voltage and provides the control line signals of the un-selected memory sectors with a un-erase control voltage, voltage levels of the erase control voltage and the un-erase control voltage are different,
   wherein the voltage level of the un-erase control voltage equals to the voltage level applied on the first well subtracted by a threshold voltage when the erasing operation is operated.

2. The non-volatile memory apparatus as claimed in claim 1,
   wherein voltage levels of a plurality of word line signals respectively received by the memory cells in all of the first memory sectors are the same when the erasing operation is operated.

3. The non-volatile memory apparatus as claimed in claim 1, further comprising:
   a plurality of second memory sectors, disposed in a second well,
   wherein, when the erasing operation is operated and the second memory sectors are not selected for erasing, voltage levels of control signals of memory cells in the second memory sectors are equal to a voltage level applied on the second well.

4. The non-volatile memory apparatus as claimed in claim 1, further comprising:
   a sector selecting device, coupled to a plurality of bit lines of the first memory sectors.

* * * * *